United States Patent
Chang

(10) Patent No.: US 9,473,143 B2
(45) Date of Patent: Oct. 18, 2016

(54) DRIVING CIRCUIT FOR GENERATING VOLTAGE CONTROL SIGNALS

(71) Applicant: Raydium Semiconductor Corporation, Hsinchu (TW)

(72) Inventor: Kuen-Shan Chang, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/703,588

(22) Filed: May 4, 2015

(65) Prior Publication Data

US 2015/0318795 A1 Nov. 5, 2015

(30) Foreign Application Priority Data

May 5, 2014 (TW) .............................. 103115942 A

(51) Int. Cl.
- *H03K 3/00* (2006.01)
- *H03K 19/0185* (2006.01)
- *H02M 7/537* (2006.01)

(52) U.S. Cl.
CPC ..... *H03K 19/018557* (2013.01); *H02M 7/537* (2013.01)

(58) Field of Classification Search
None
See application file for complete search history.

(56) References Cited

U.S. PATENT DOCUMENTS

| | | | |
|---|---|---|---|
| 7,109,758 B2 * | 9/2006 | Lin | H03K 19/0013 326/108 |
| 7,932,764 B2 * | 4/2011 | Chou | H03K 5/133 327/108 |

* cited by examiner

*Primary Examiner* — Long Nguyen

(57) ABSTRACT

A driving circuit includes an activating end, an operation switch, a voltage control end, and an output switch. The activating end selectively outputs a first voltage control signal and a second voltage control signal. The operation switch is turned off according to the first voltage control signal to generate a low voltage control signal or is turned on according to the second voltage control signal to generate a high voltage control signal. The voltage control end generates a low voltage according to the low voltage control signal or generates a bias voltage according to the high voltage control signal. The output switch is turned off according to the low voltage to determine that an output voltage is the same as the low voltage, or is turned on according to the bias voltage to determine that the output voltage is the same as the high voltage.

10 Claims, 5 Drawing Sheets

DRIVING CIRCUIT FOR GENERATING VOLTAGE CONTROL SIGNALS

BACKGROUND OF THE INVENTION

1. Field of the Invention

The present invention relates to a driving circuit for generating the voltage control signals, in particular, to a driving circuit capable of reducing cost and solving the timing control problems.

2. Description of the Related Art

The driving circuit of a conventional display contains a positive power voltage and a negative power voltage, thereby increasing the operating voltage range of the circuit. In general, the driving circuit converts a low voltage signal to a high voltage signal by using the level shifter. For example, if the maximum operating voltage of the analog circuit is 6 volt while the voltage of the digital circuit is 1.5 volt, when a voltage signal to be transmitted from the digital circuit to the analog circuit, the voltage level must be converted.

In practice, the general MOS analog circuit can withstand such a voltage difference for the conversion from 1.5 volt to 6 volt. However, when the 1.5 volt to be converted to a negative voltage of −6 volt, such a voltage difference will exceed the capability of maximum voltage stress for the MOS device.

Some developers use the high voltage components in MOS analog circuits, such as ±15 volt, in order to withstand the aforesaid voltage difference. However, if using a large amount of high voltage components, not only more space but also additional cost is required.

In addition, the developers try to provide an intermediate voltage level (VCL) between 1.5 volt and −6 volt and try to solve the problems of the voltage stress and the timing of the power level in the MOS analog circuit. That is, the intermediate voltage level is usually generated by the analog negative power voltage (AVEE), and the intermediate voltage level is about −2.5 volt. However, in practice, the activating time of the intermediate voltage level will be after the activating time of the analog negative power voltage. In other words, if the digital circuit uses the intermediate voltage level to transmit the activating control signal of the analog negative power voltage, the activation of the analog negative power voltage will fail. Therefore, the approach of using the intermediate voltage level still has some timing problems in the system application.

SUMMARY OF THE INVENTION

In view of the above problems of the prior art, the present invention provides a driving circuit capable of reducing cost and solving the timing control problems.

In one aspect, the present invention provides a driving circuit capable of reducing cost and circuit space without using high voltage elements.

In another aspect, the present invention provides a design of a logic circuit of a driving circuit to provide the voltage signal.

One object of the present invention is to provide a driving circuit including an activating end, an operation switch, a voltage control end, and an output switch. The activating end selectively outputs a first voltage control signal and a second voltage control signal. The operation switch is coupled with the activating end and is driven to be deactivated according to the first voltage control signal to generate a low voltage control signal or is driven to be activated according to the second voltage control signal to generate a high voltage control signal. The voltage control end is coupled with the operation switch and generates a low voltage according to the low voltage control signal or generates a bias voltage according to the high voltage control signal. The output switch is coupled with the voltage control end and is driven to be deactivated according to the low voltage of the voltage control end to determine that an output voltage is the same as the low voltage, or is driven to be activated according to the bias voltage of the voltage control end to determine that the output voltage is the same as the high voltage.

Compared to the prior art, the driving circuit of the present invention uses the first voltage control signal and the second voltage control signal to control the operation switch and the output switch, thereby simplifying the structure of the front end circuit, so that the cost and the circuit space can be reduced. In practice, the driving circuit of the present invention can effectively generate the desired negative voltage signal to the system through the on-off control of the switches, without using the high voltage element. In one embodiment, the driving circuit further uses a plurality of cascaded elements to share the cross voltages thereon, thus a sufficient capability of voltage stress can be obtained. In addition, because the driving circuit of the present invention does not use the negative voltage level associated with the timing control signal, the error rate of initiating the circuit can be reduced.

The advantages and spirit of the present invention may be understood by the following detailed description and the accompanying drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

According to a preferred embodiment of the present invention, the present invention provides a driving circuit for generating a voltage control signal of the frond end. Specifically, the driving circuit of the present invention is capable of generating the negative voltage control signal neither use of the intermediate potential (VCL) nor a large amount of high voltage components. In other words, the driving circuit of the present invention can effectively provide the required negative voltage control signal and reduce the cost and circuit area.

Figure 1:
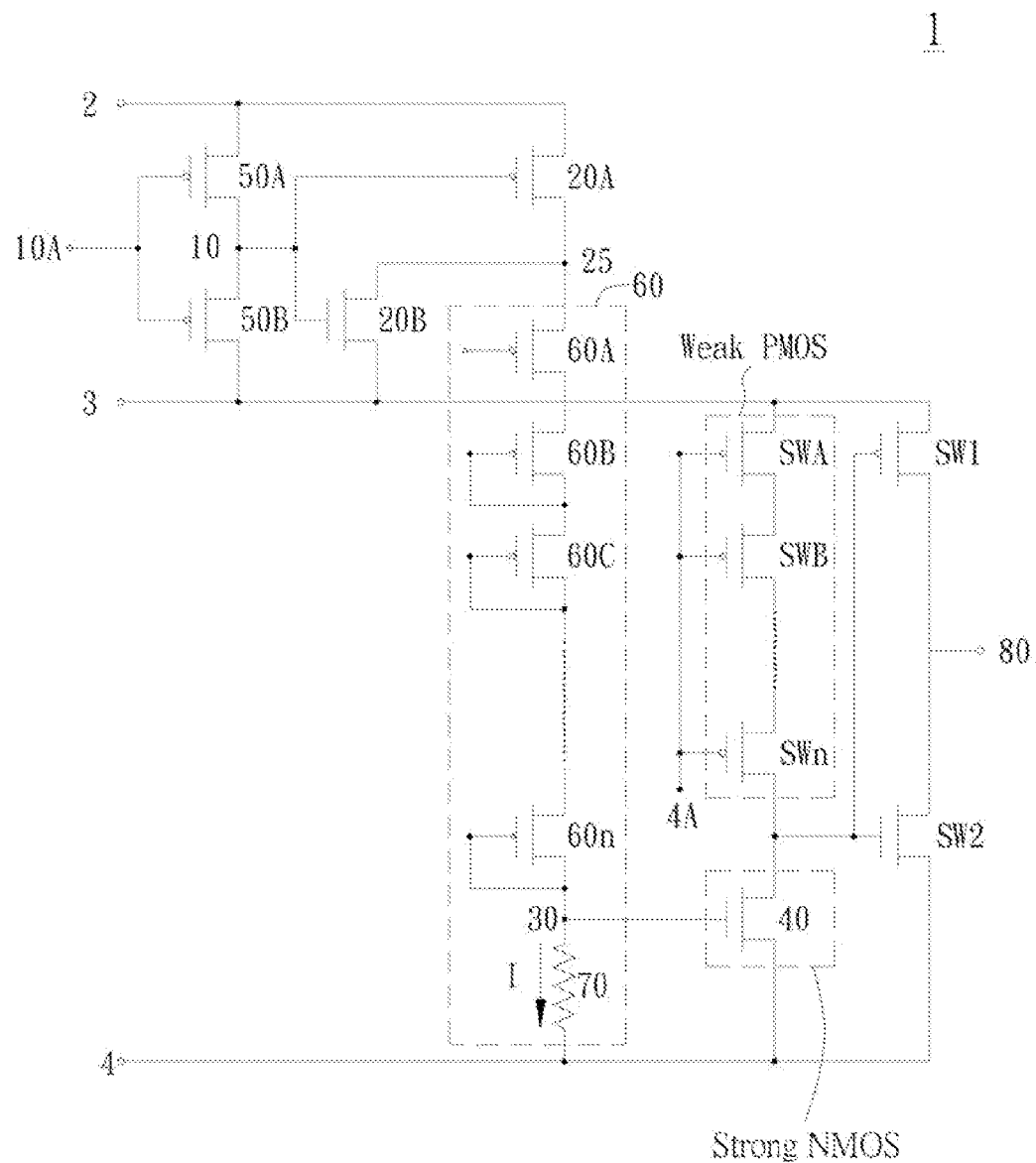
FIG. 1 schematically illustrates a driving circuit according to a preferred embodiment of the present invention.

Referring to FIG. 1, FIG. 1 schematically illustrates a driving circuit according to a preferred embodiment of the present invention. As shown in FIG. 1, the driving circuit 1 includes an inverting activating end 10A, a first inverting switch 50A, a second inverting switch 50B, an activating end 10, the operation switches 20A and 20B, a setting end 25, a voltage control end 30, a cascade circuit module 60, an output switch 40, the switches SW1 and SW2, a plurality of active loads SWA, SWB, . . . , SWn, a first power end 2, a ground end 3, and the low voltage power ends 4 and 4A.

In this embodiment, the first power end 2 is an internal power voltage and generates a first voltage control signal, wherein the first voltage control signal is 1.5 volt, but is not limited thereto. In addition, the ground end 3 is connected to zero potential and coupled with the second inverting switch 50B and the operation switch 20B, for generating a second voltage control signal, wherein the second voltage control signal is zero voltage (0 volt). In addition, the low voltage power end 4 provides a negative voltage power and outputs a low voltage, wherein the low voltage is the negative power voltage and can be −6 volt, but is not limited thereto.

Figure 2:
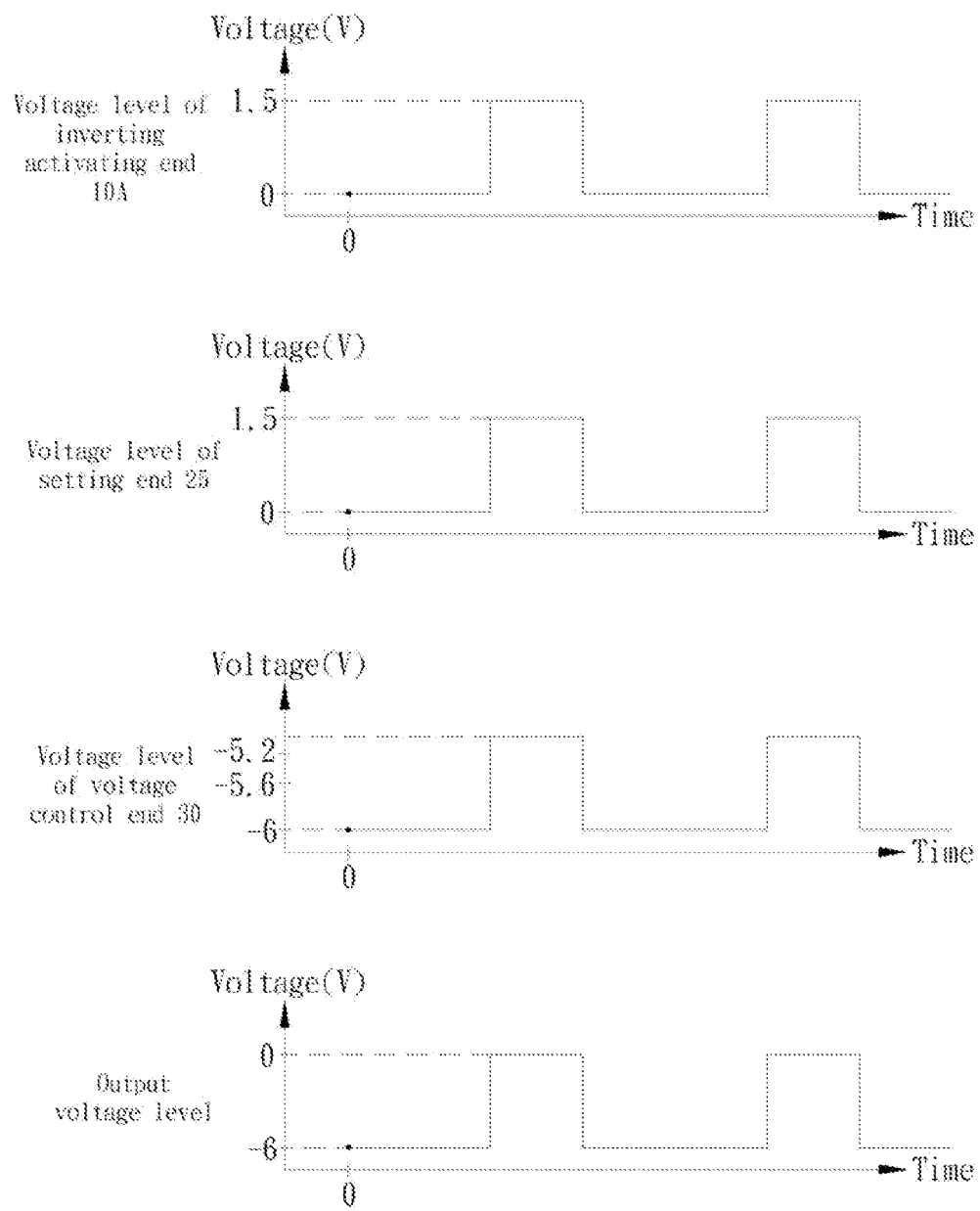
FIG. 2 shows a schematic diagram of the voltage control signal according to the present invention.

As shown in FIG. 1, the first inverting switch 50A and the second inverting switch 50B are coupled with the inverting activating end 10A. Precisely, the inverting activating end 10A is coupled with the gates of the first inverting switch 50A and the second inverting switch 50B to control the inverting switches 50A and 50B to be turned on or turned off. In practice, the driving circuit 1 can receive the first inverting control signal or the second inverting control signal from the external device or other coupled devices, such that the inverting activating end 10A selectively receives the first inverting control signal or the second inverting control signal, and then controls and determines the output signal of the driving circuit 1. In addition, the first inverting switch 50A and the second inverting switch 50B together form an inverter capable of controlling the phase of the input signal. For example, as shown in FIG. 2, which shows a schematic diagram of the voltage control signal according to the present invention, the voltage level of the first inverting control signal of the inverting activating end 10A is 0 volt and the voltage level of the second inverting control signal is 1.5 volt, but is not limited thereto.

Figure 4:
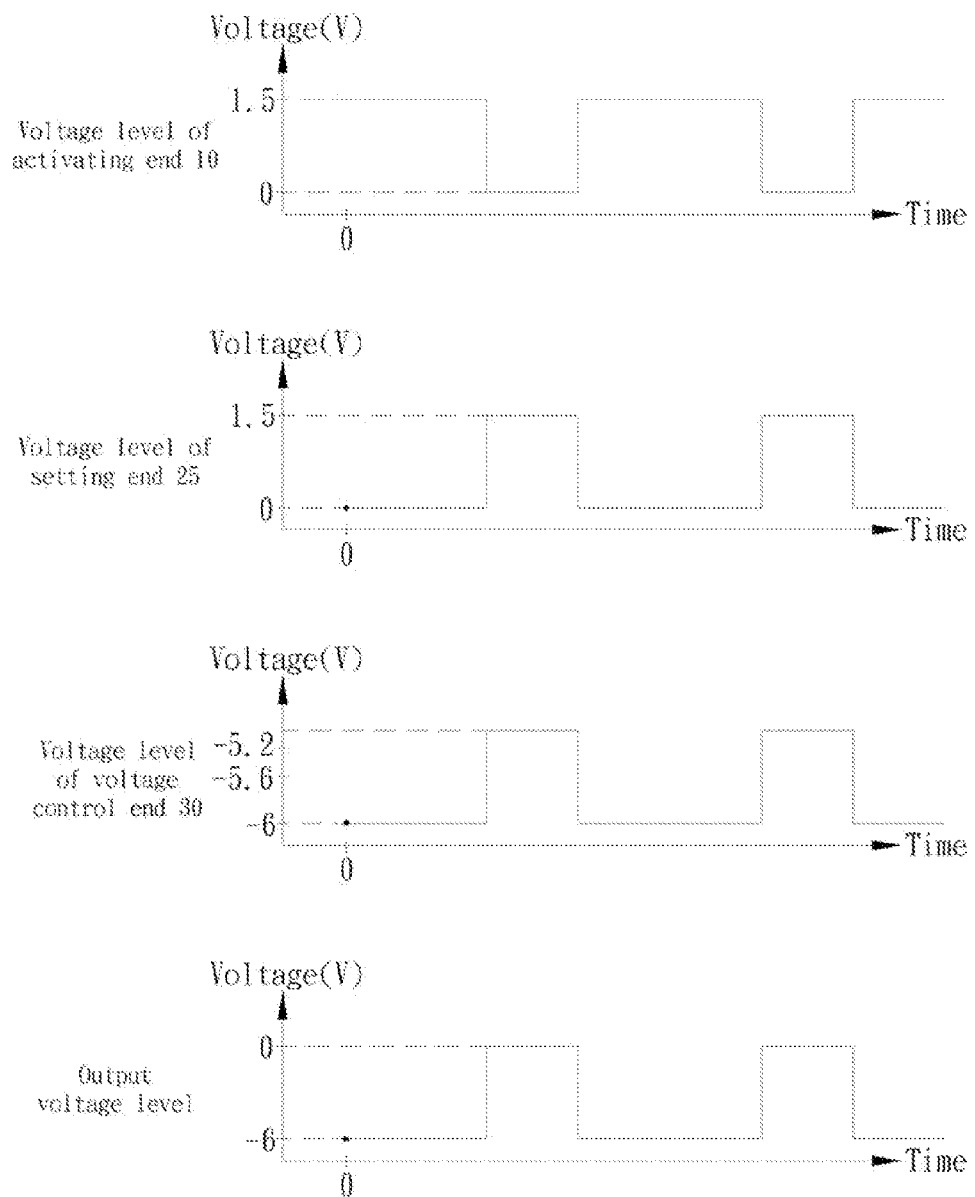
FIG. 4 shows another schematic diagram of the voltage control signal according to the present invention.

The situation of the inverting activating end 10A having the first inverting control signal and the activating end 10 having the first voltage control signal is first discussed. In this embodiment, the first inverting switch 50A is turned on according to the first inverting control signal (0 volt) to generate the first voltage control signal (1.5 volt) to the activating end 10, wherein the first voltage control signal is generated by the first power end 2. In practice, the voltage level of the activating end 10 and the voltage level of the inverting activating end 10A are inverted, thus the voltage level of the activating end 10 is 1.5 volt when the voltage level of the inverting activating end 10A is 0 volt. As shown in FIG. 2 and FIG. 4, at the same timing, the phase of the inverting activating end 10A and the phase of the activating end 10 are in opposite phase.

It should be noted, the activating end 10 is coupled with the gates of the operation switches 20A and 20B to control the operation switches 20A and 20B to be turned on or turned off. In this embodiment, the operation switch 20A is a PMOS switch and the operation switch 20B is an NMOS switch, but not limited thereto.

In addition, the first voltage control signal of the activating end 10 is transmitted to the operation switch 20A and the operation switch 20B to control the operation switch 20A to be turned off and the operation switch 20B to be turned on. The operation switch 20A is turned off according to the first voltage control signal to generate the low voltage control signal to the setting end 25, such that the voltage level of the setting end 25 is set to zero potential and the current path is in the open status.

In practice, one end of the output switch 40, i.e. the low voltage power end 4, has a negative voltage level (−6 volt), and the output switch 40 determines the level of the output voltage of the output end 80 is the same as the negative voltage level according to the voltage level of the setting end 25 set to zero potential. In addition, the voltage control end 30 is coupled to the operation switch 20A via the cascade circuit module 60 and generates the low voltage according to the low voltage control signal. In this case, the voltage control end 30 generates the low voltage according to the low voltage control signal of the setting end 25, wherein the low voltage is the same as the voltage of the second power end 4, i.e. −6 volt. In addition, the output switch 40 is turned off according to the low voltage of the voltage control end 30 to determine that the output voltage of the output end 80 is the same as the low voltage (−6 volt). In other words, according to the control of the voltage signal described above, the output voltage having −6 volt is obtained.

Next, the situation of the inverting activating end 10A having the second inverting control signal and the activating end 10 having the second voltage control signal is discussed. As shown in FIG. 1 and FIG. 2, the inverting activating end 10A selectively generates the second inverting control signal (1.5 volt) to the second inverting switch 50B, and the second inverting switch 50B is driven to be activated according to the second inverting control signal to generate the second voltage control signal (0 volt) to the activating end 10. When the voltage level of the inverting activating end 10A is 1.5 volt, the voltage level of the activating end 10 is 0 volt. In practice, the second voltage control signal of the activating end 10 is transmitted to the operation switch 20A and the operation switch 20B to control the operation switch 20A to be turned on and the operation switch 20B to be turned off.

In addition, the cascade circuit module 60 is coupled with the operation switch 20A and has a plurality of elements 60A, 60B, 60C, . . . , 60n and an output resistor 70, wherein the output resistor 70 is coupled with the voltage control end 30 and the output switch 40 and has a resistance. As shown in FIG. 1, the voltage control end 30 is coupled with the operation switch 20A via the cascade circuit module 60 and generates a bias voltage according to the high voltage control signal.

It should be noted, as shown in FIG. 1 and FIG. 2, when the operation switch 20A is driven to be activated according to the second voltage control signal to generate the high voltage control signal, a current I flows through the elements of the cascade circuit module 60 so as to generate the bias voltage of the voltage control end 30, such that the output switch 40 is driven to be activated according to the bias voltage of the voltage control end 30 to determine that the output voltage of the output end 80 is the same as a high voltage, wherein the high voltage is 0 volt. In addition, the bias voltage of the voltage control end 30 is greater than or equal to the voltage level (−6 volt) of the low voltage power end 4, and less than or equal to 0 volt. In other words, since the active loads SWA~SWn are weak active loads, the level of the voltage control end 30 only need to be greater than the threshold voltage (Vth) of the element, and thus can easily control the output switch 40 (NMOS) to be turned on or turned off.

Further, when the current I flows through the elements 60A~60n of the cascade circuit module 60, the cross voltages of the elements 60A~60n are redistributed. In practice, the larger voltage will be shared equally by the elements 60A~60n, so that the voltage stress withstood by each element can be reduced effectively. It should be noted that the amount of the elements 60A~60n is determined based on the magnitude of the current I, wherein the magnitude of the current I is in relation to the resistance of the output resistor 70. In this embodiment, the resistance of the output resistor 70 is proportional to the bias voltage while inversely proportional to the current I.

As shown in FIG. 2, when the bias voltage of the voltage control end 30 is greater than the threshold voltage of the output switch 40, the output switch 40 is driven to be activated so that the level of the output voltage of the output end 80 is zero potential. Specifically, the present invention controls the operation switch 20A to be activated or deactivated through the voltage control signal of the inverting activating end 10A so that the voltage level of the output end 80 can be controlled in the negative power voltage (AVEE, −6 volt) or zero potential (0 volt). It should be noted that the cross voltages of the elements 60A~60n of the cascade circuit module 60 can be redistributed so as to effectively share the cross voltage of each element and the overstress of each element can be reduced.

Figure 3:
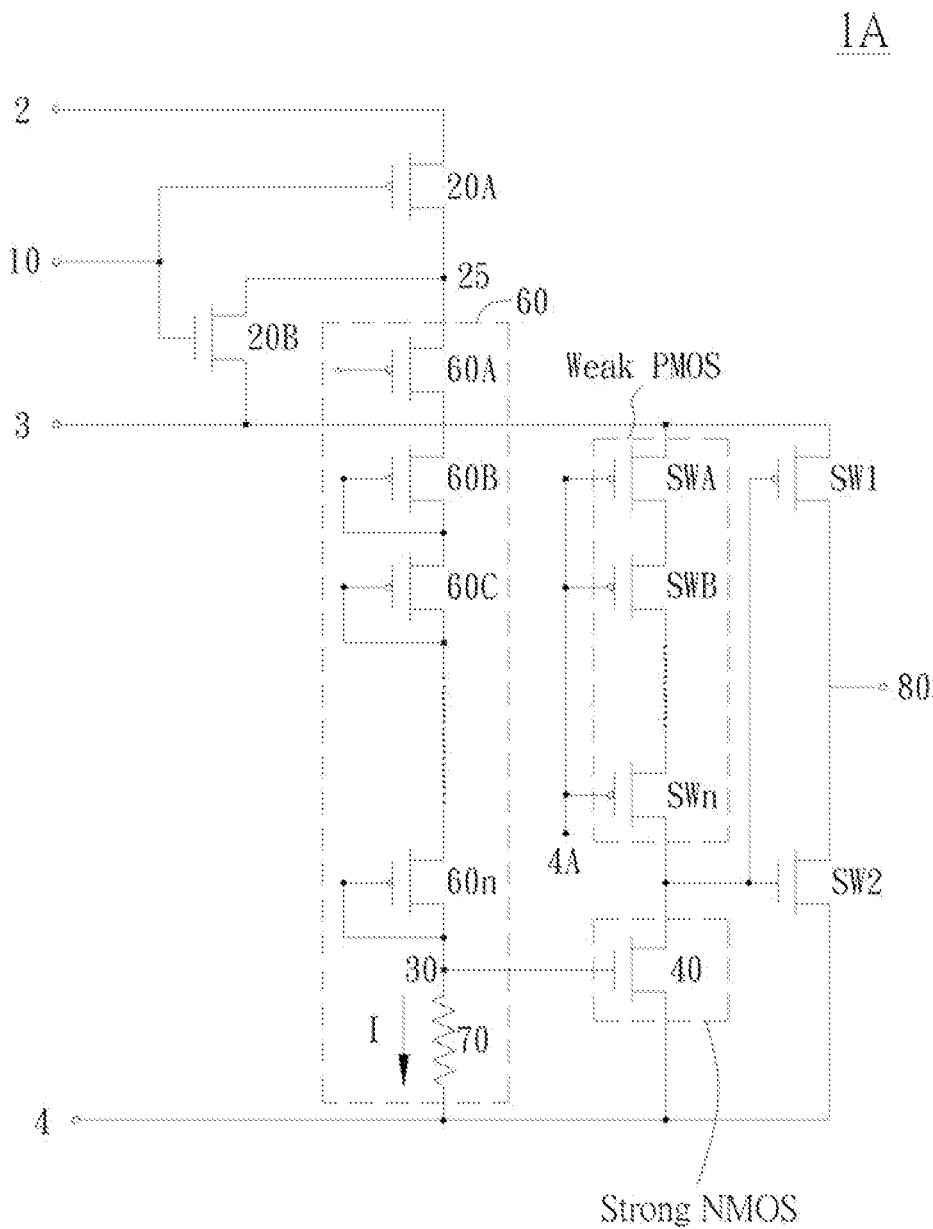
FIG. 3 schematically illustrates a driving circuit according to another preferred embodiment of the present invention.

Refer to FIG. 3, which schematically illustrates a driving circuit according to another preferred embodiment of the present invention. It should be noted that the activating end 10 in this embodiment is not coupled with the inverter; in other words, the driving circuit 1A can determine whether to provide the inverter according to the information of the voltage control signal, and the inverter may be provided in the end of the driving circuit or coupled to other suitable control ends, but not limited thereto.

In addition, the activating end 10 selectively outputs a first voltage control signal and a second voltage control signal. In practice, the voltage level of the first voltage control signal is different from the voltage level of the second voltage control signal. The operation switch 20A is coupled with the activating end 10 and is driven to be deactivated according to the first voltage control signal to generate a low voltage control signal, or is driven to be activated according to the second voltage control signal to generate a high voltage control signal.

Refer to FIG. 4, which shows another schematic diagram of the voltage control signal according to the present invention. As shown in FIG. 4, when the voltage signal of the activating end 10 is 1.5 volt, which represents the control signal is HIGH, the operation switch 20A is turned off and the operation switch 20B is turned on, so that the voltage of the setting end 25 is set to 0 volt and the current path is in the open status. It should be noted that the output switch 40 is coupled between the voltage control end 30 and the output end 80; the output switch 40 is driven to be deactivated according to the low voltage of the voltage control end 30 to determine that the output voltage of the output end 80 is the same as the low voltage, or is driven to be activated according to the bias voltage of the voltage control end 30 to determine that the output voltage of the output end 80 is the same as the high voltage.

When the voltage level of the activating end 10 is HIGH, the operation switch 20A is turned off and the operation switch 20B is turned on, so that the voltage level of the voltage control end 30 is the same as the low voltage level of the low voltage power end 4A. In this embodiment, the low voltage levels of the low voltage power ends 4 and 4A are −6 volt, but not limited thereto. Specifically, when the voltage level of the voltage control end 30 is −6 volt, the output switch 40 is turned off so that the output voltage of the output end 80 is −6 volt.

When the operation switch generates the high voltage control signal, the current flows through the switches to generate the bias voltage of the voltage control end. When the voltage level of the activating end 10 is LOW, the operation switch 20A is turned on, the cross voltages of the elements 60A~60n of the cascade circuit module 60 are redistributed, so that the level of the bias voltage of the voltage control end 30 is proportional to the current. In this embodiment, the bias voltage level of the voltage control end 30 is proportional to the product of the current I and the resistance of the output resistor 70. When the bias voltage level of the voltage control end 30 is greater than the threshold voltage of the output switch 40, the output switch 40 is turned on so that the level of the output voltage is zero potential.

Figure 5:
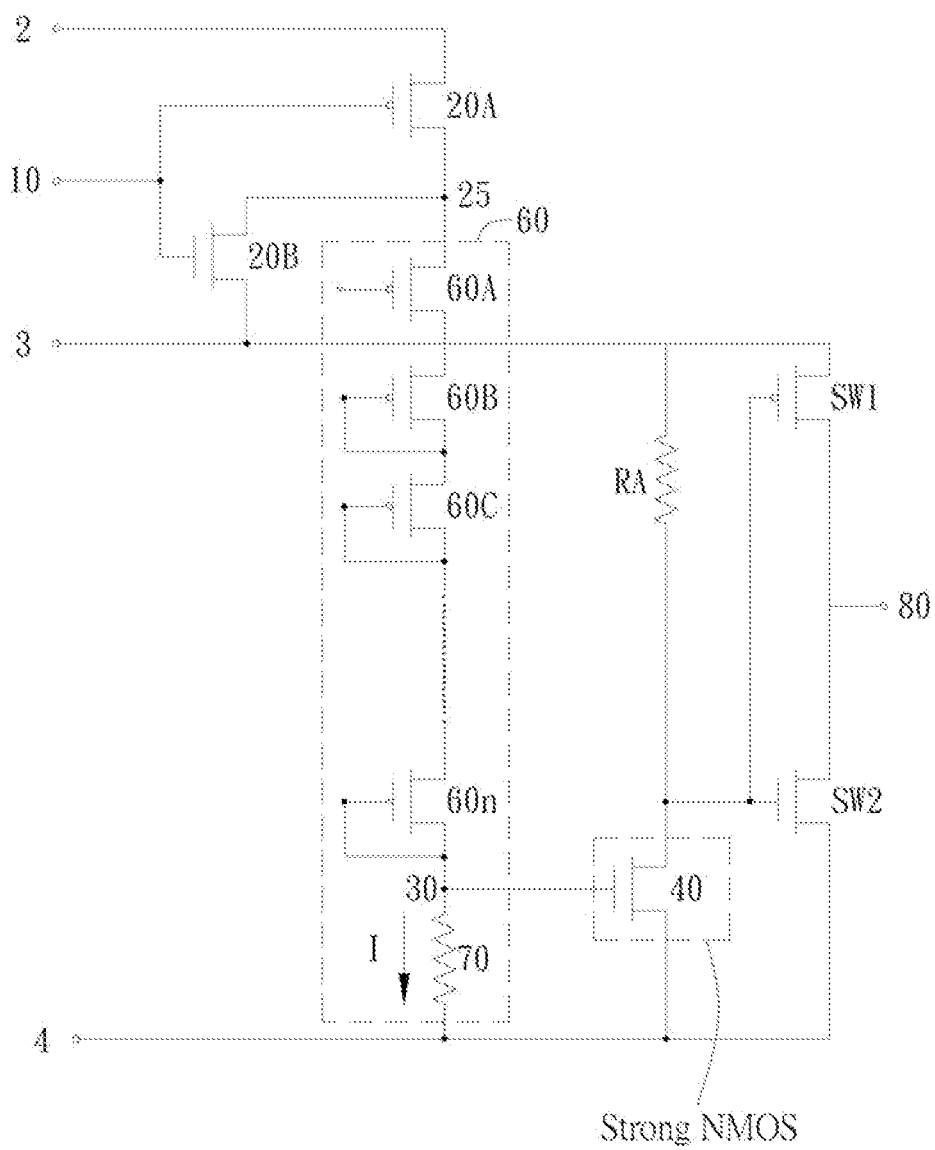
FIG. 5 schematically illustrates a driving circuit according to another preferred embodiment of the present invention.

Refer to FIG. 5, which schematically illustrates a driving circuit according to another preferred embodiment of the present invention. As shown in FIG. 5, with respect to FIG. 1 using the active loads SWA, SWB~SWn as the weak PMOS element, the driving circuit 1B of FIG. 5 uses a resistor RA as the passive load. It should be noted, in other embodiments, the driving circuit can use other passive elements as the passive load and may not be limited to the resistor elements, but not limited thereto. The detailed operation of the other elements is similar to that described in the embodiments of FIG. 1 and FIG. 3 and not to be repeated here.

Compared to the prior art, the driving circuits 1 and 1A of the present invention use the first voltage control signal and the second voltage control signal to control the operation switch and the output switch, thereby simplifying the structure of the front end circuit, so that the cost and the circuit space can be reduced. In practice, the driving circuit of the present invention can effectively generate the desired negative voltage signal to the system through the on-off control of the switches, without using the high voltage element. In one embodiment, the driving circuits 1 and 1A further use a plurality of cascaded elements to share the cross voltages thereon, thus a sufficient capability of voltage stress can be obtained. In addition, because the driving circuit of the present invention does not use the timing control signal, the error rate of initiating the circuit can be reduced.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

The invention claimed is:

1. A driving circuit, comprising:
an activating end for selectively outputting a first voltage control signal and a second voltage control signal;
an operation switch coupled with the activating end, wherein the operation switch is driven to be deactivated when the operation switch receives the first voltage control signal to generate a low voltage control signal, and the operation switch is driven to be activated when the operation switch receives the second voltage control signal to generate a high voltage control signal;
a voltage control end coupled with the operation switch, wherein the voltage control end generates a low voltage when the voltage control end receives the low voltage control signal, and the voltage control end generates a bias voltage when the voltage control end receives the high voltage control signal; and
an output switch coupled with the voltage control end, wherein the output switch is driven to be deactivated when the output switch receives the low voltage of the voltage control end to determine that an output voltage is the same as the low voltage, and the output switch is driven to be activated when the output switch receives the bias voltage of the voltage control end to determine that the output voltage is the same as a high voltage.

2. The driving circuit of claim 1, further comprising:
an inverting activating end for selectively receiving a first inverting control signal and a second inverting control signal;
a first inverting switch coupled with the inverting activating end, wherein the first inverting switch is driven to be activated when the first inverting switch receives the first inverting control signal to generate the first voltage control signal to the activating end; and
a second inverting switch coupled with the inverting activating end and the first inverting switch, wherein the second inverting switch is driven to be activated when the second inverting switch receives the second inverting control signal to generate the second voltage control signal to the activating end.

3. The driving circuit of claim 1, further comprising:
a cascade circuit module coupled with the operation switch and having a plurality of elements, wherein when the operation switch generates the high voltage control signal, a current flows through the elements so as to generate the bias voltage of the voltage control end.

4. The driving circuit of claim 1, wherein when the bias voltage of the voltage control end is greater than a threshold voltage of the output switch, the output switch is driven to be activated so that the level of the output voltage is zero potential.

5. The driving circuit of claim 3, wherein the amount of the elements is determined based on the magnitude of the current.

6. The driving circuit of claim 3, wherein the cross voltages of the elements are redistributed, so that the level of the bias voltage is proportional to the current.

7. The driving circuit of claim 3, wherein an end of the output switch has a negative voltage level, and the output switch determines that the level of the output voltage is the same as the negative voltage level.

8. The driving circuit of claim 3, wherein the cascade circuit module further comprises:
an output resistor coupled with the voltage control end and the output switch and having a resistance, wherein the resistance is proportional to the bias voltage while inversely proportional to the current.

9. The driving circuit of claim 2, further comprising:
a first power end coupled with the first inverting switch, the first power end generating the first voltage control signal.

10. The driving circuit of claim 8, further comprising:
a low voltage power end coupled with the output resistor and the output switch, the low voltage power end outputting the low voltage.

* * * * *